(12) United States Patent
Zheng et al.

(10) Patent No.: US 10,983,633 B2
(45) Date of Patent: Apr. 20, 2021

(54) KEY DETECTING METHOD AND APPARATUS

(71) Applicant: SHENZHEN GOODIX TECHNOLOGY CO., LTD., Shenzhen (CN)

(72) Inventors: Yinxiang Zheng, Shenzhen (CN); Canhong Du, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 332 days.

(21) Appl. No.: 16/133,669

(22) Filed: Sep. 17, 2018

(65) Prior Publication Data
US 2019/0018054 A1   Jan. 17, 2019

Related U.S. Application Data

(63) Continuation of application No. PCT/CN2017/073773, filed on Feb. 16, 2017.

(51) Int. Cl.
*G01R 29/26* (2006.01)
*G06F 3/041* (2006.01)
(Continued)

(52) U.S. Cl.
CPC ........... *G06F 3/0418* (2013.01); *G01R 29/26* (2013.01); *G06F 3/0416* (2013.01);
(Continued)

(58) Field of Classification Search
CPC ....... G01R 29/26; G06F 3/0416; G06F 3/044; G06F 3/04886; H03K 17/962
See application file for complete search history.

(56) References Cited

U.S. PATENT DOCUMENTS

2013/0293511 A1* 11/2013 Nam .................... G06F 3/0443
345/174
2015/0253896 A1* 9/2015 Kim .................... G06F 3/04182
345/174
(Continued)

FOREIGN PATENT DOCUMENTS

CN   103365469 A   10/2013
CN   105045426 A   11/2015
(Continued)

OTHER PUBLICATIONS

Srinivasagam, Kannan et al., "Differentiating Noise from Real Touch—The Key to Robust Capacitive Sensing" Cypress Semiconductor Corp., (Oct. 2010), pp. 1-8, https://www.cypress.com/file/106556/download, also Published in EE Times Design.
(Continued)

*Primary Examiner* — Mohammad K Islam
(74) *Attorney, Agent, or Firm* — J.C. Patents

(57) ABSTRACT

A key detecting method and apparatus, which relate to touch sensing technologies, where the key detecting method includes: sampling an output signal value, and calculating a current noise value and a current signal value respectively according to the sampling result (S101); determining, according to the current noise value and the current signal value, whether a noise variation and a signal variation reach a corresponding noise variation threshold and signal variation threshold, respectively (S102); and determining an operating state of a key according to the determination result (S103). With the above method and apparatus, there is no need to additionally provide a complex auxiliary circuit to realize detection of a state of the key, instead, a state of a smart terminal is determined by correspondingly sampling and calculating the signal value, thereby reducing the cost
(Continued)

and meanwhile improving the accuracy of the detection of the state of the key.

17 Claims, 4 Drawing Sheets

(51) Int. Cl.
*H03K 17/96* (2006.01)
*G06F 3/044* (2006.01)
*G06F 3/02* (2006.01)
*G06F 3/0488* (2013.01)

(52) U.S. Cl.
CPC ....... *G06F 3/04182* (2019.05); *H03K 17/962* (2013.01); *G06F 3/02* (2013.01); *G06F 3/04886* (2013.01)

(56) References Cited

U.S. PATENT DOCUMENTS

| | | | |
|---|---|---|---|
| 2016/0092028 A1* | 3/2016 | Vallis | G06F 3/0446 |
| | | | 345/174 |
| 2016/0216794 A1* | 7/2016 | Yoon | G06F 3/041 |

FOREIGN PATENT DOCUMENTS

| | | |
|---|---|---|
| CN | 105573553 A | 5/2016 |
| CN | 105980960 A | 9/2016 |

OTHER PUBLICATIONS

The extended European Search Report of corresponding European application No. 17896698, dated Oct. 10, 2019.
The International Search Report of corresponding International PCT Application No. PCT/CN2017/073773, dated Sep. 17, 2017.

\* cited by examiner

KEY DETECTING METHOD AND APPARATUS

CROSS-REFERENCE TO RELATED APPLICATIONS

This application is a continuation of International Application No. PCT/CN2017/073773, filed on Feb. 16, 2017, the disclosure of which is hereby incorporated by reference in its entirety.

TECHNICAL FIELD

The present application relates to the field of touch sensing technologies and, in particular, to a key detecting method and apparatus.

BACKGROUND

While a mobile phone is connected to a charger, common-mode interference can be easily incurred when human hands touch a key phone (such as a Home key or a virtual key) of the mobile phone, as shown in FIG. 1; typically, the human body is equivalent to a resistor $R_M$ of 1 kΩ and a capacitor $C_M$ of 1 nF in series, which is easy to cause a key detection error, thereby resulting in a situation of unstable key or constant popping-up. In order to make the key adaptable to different chargers, special handling is required when strong common-mode interference occurs. A common method to handle the common-mode interference is to avoid the interfering frequency through frequency hopping. However, when solving the problem of key detection error through frequency hopping technologies, a complex circuit is needed to achieve fast and reliable frequency conversion, which is difficult and costly to implement.

SUMMARY

In order to overcome deficiencies of related products in the prior art, the present application proposes a key detecting method and apparatus, which aim to solve the problem that it is difficult and costly to solve the current key detection error.

The present application provides a key detecting method, including: sampling an output signal value, and calculating a current noise value and a current signal value, respectively, according to the sampling result; determining, according to the current noise value and the current signal value, whether a noise variation and a signal variation reach a corresponding noise variation threshold and signal variation threshold, respectively; and determining an operating state of a key according to the determination result.

As an improvement to the key detecting method provided in the present application, the sampling an output signal value and the calculating a current noise value and a current signal value according to sampling result include: sampling the output signal value in real time for multiple consecutive times and obtaining multiple sampling results; and calculating an average value and a peak-to-peak value of the multiple sampling results, and using the average value and the peak-to-peak value as the current signal value and the current noise value, respectively.

As an improvement to the key detecting method provided in the present application, the noise variation is a difference between the current noise value and a base noise value, and the signal variation is a difference between the current signal value and a base signal value.

As an improvement to the key detecting method provided in the present application, further including: sampling, in the absence of a touch on the key from a human body, the output signal values for multiple consecutive times to obtain multiple base sampling results; and calculating an average value and a peak-to-peak value of the multiple base sampling results, and using the average value and the peak-to-peak value of the multiple base sample results as the base signal value and the base noise value, respectively.

As an improvement to the key detecting method provided in the present application, the determining an operating state of a key according to the determination result includes: determining that the key is in a key-pressed state when at least one of the signal variation and the noise variation reaches its corresponding signal variation threshold or noise variation threshold; determining that the key is in a key-released state when both the signal variation is less than the signal variation threshold and the noise variation is less than the noise variation threshold.

As an improvement to the key detecting method provided in the present application, the determining whether a noise variation and a signal variation reach corresponding noise variation threshold and signal variation threshold includes: setting the noise determination result Noe to 1 when the difference between the current noise value and the base noise value reaches the preset noise variation threshold, otherwise, setting the noise determination result Noe to 0; setting a signal determination result Sig to 1 when the difference between the current signal value and the base signal value reaches the preset signal variation threshold, otherwise, setting the signal determination result Sig to 0.

As an improvement to the key detecting method provided in the present application, the determining the operating state of a key according to the determination result includes: determining the operating state of the key according to K=Sig|Noe, where K represents the operating state of the key, Noe is the noise determination result, Sig is the signal determination result, and "|" is a logic OR operation; and determining that the key is in a key-pressed state when K=1, and determining that the key is in a key-released state when K=0.

The present application further provides a key detecting apparatus, including: a sampling unit, configured to sample an output signal value and calculate a current noise value and a current signal value respectively according to sampling result; a determining unit, configured to determine, according to the current noise value and the current signal value, whether a noise variation and a signal variation reach a corresponding noise variation threshold and signal variation threshold, respectively; and a state determining unit, configured to determine an operating state of a key according to the determination result of the determining unit.

As an improvement to the key detecting apparatus provided in the present application, the sampling unit includes: a sampling subunit, configured to sample the output signal value in real time for multiple consecutive times and obtain multiple sampling results; and a calculating subunit, configured to calculate an average value and a peak-to-peak value of the multiple sampling results, and use the average value and the peak-to-peak value as the current signal value and the current noise value, respectively.

As an improvement to the key detecting apparatus provided in the present application, further including: a difference calculating unit, configured to calculate a difference between the current noise value and a base noise value use the difference as the noise variation, and calculate a difference between the current signal value and a base signal value and use the difference as the signal variation.

As an improvement to the key detecting apparatus provided in the present application, further including: a base determining unit, configured to predetermine the base noise value and the base signal value in the absence of a touch on the key from a human body.

As an improvement to the key detecting apparatus provided in the present application, the base determining unit includes: a base sampling subunit, configured to sample, in the absence of the touch on the key from the human body, the output signal value for multiple consecutive times to obtain multiple base sampling results; and a base calculating subunit, configured to calculate an average value and a peak-to-peak value of the multiple base sampling results, and use the average value and the peak-to-peak value of the multiple base sampling results as the base signal value and the base noise value, respectively.

As an improvement to the key detecting apparatus provided in the present application, the state determining unit is configured to: determine that the key is in a key-pressed state when at least one of the signal variation and the noise variation reaches its corresponding signal variation threshold or noise variation threshold; and determine that the key is in a key-released state when both the signal variation is less than the signal variation threshold and the noise variation is less than the noise variation threshold.

As an improvement to the key detecting apparatus provided in the present application, the determining unit includes: a noise variation determining subunit, configured to set the noise determination result Noe to 1 when the difference between the current noise value and the base noise value reaches the preset noise variation threshold, otherwise, set the noise determination result Noe to 0; and a signal variation determining subunit, configured to set a signal determination result Sig to 1 when the difference between the current signal value and the base signal value reaches the preset signal variation threshold, otherwise, set the signal determination result Sig to 0.

As an improvement to the key detecting apparatus provided in the present application, the state determining unit includes: a logic OR operation subunit, configured to perform a logic OR operation on the noise determination result Noe and the signal determination result Sig according to K=Sig|Noe, where K represents the operating state of the key, and "|" is a logic OR operation; and a state determining subunit, configured to determine that the key is in a key-pressed state when K=1, and determine that the key is in a key-released state when K=0.

The present application further provides a key detecting method, including: sampling an output signal value of a key when there is external common mode interference, and calculating a current noise value; determining, according to the current noise value, whether a noise variation reaches a noise variation threshold; and determining that the key is in a key-pressed state when the noise variation reaches the noise variation threshold.

As an improvement to the key detecting method provided in the present application, the external common mode interference includes charging common mode interference introduced via a connection to a charger.

As an improvement to the key detecting method provided in the present application, the current noise value is obtained by calculating a peak-to-peak of multiple sampling results obtained by sampling the output signal value in real time for multiple consecutive times.

As an improvement to the key detecting method provided in the present application, the noise variation is a difference between the current noise value and a base noise value, where the base noise value is obtained by calculating a peak-to-peak value of multiple base sampling results obtained by sampling, in the absence of a touch on the key from a human body, the output signal value for multiple consecutive times.

As an improvement to the key detecting method provided in the present application, further including: determining whether the signal variation reaches the signal variation threshold according to a current signal value when there is no external common mode interference, and determining that the key is in the key-pressed state when the signal variation reaches the signal variation threshold.

In embodiments of the present application, there is no need to additionally provide a complex auxiliary circuit to realize detection of a state of the key, instead, a state of a smart terminal is determined by correspondingly sampling and calculating the signal value, thereby reducing the cost and meanwhile improving the accuracy of the detection of the state of the key, enabling a user to obtain better user experience.

BRIEF DESCRIPTION OF DRAWINGS

In order to describe technical solutions in the embodiments of the present application more clearly, the drawings used in the embodiments will be briefly described hereunder. Obviously, the drawings in the following description are only some embodiments of the present application. For those skilled in the art, other drawings also may be obtained based on these drawings without any creative effort.

DESCRIPTION OF EMBODIMENTS

Figure 1:
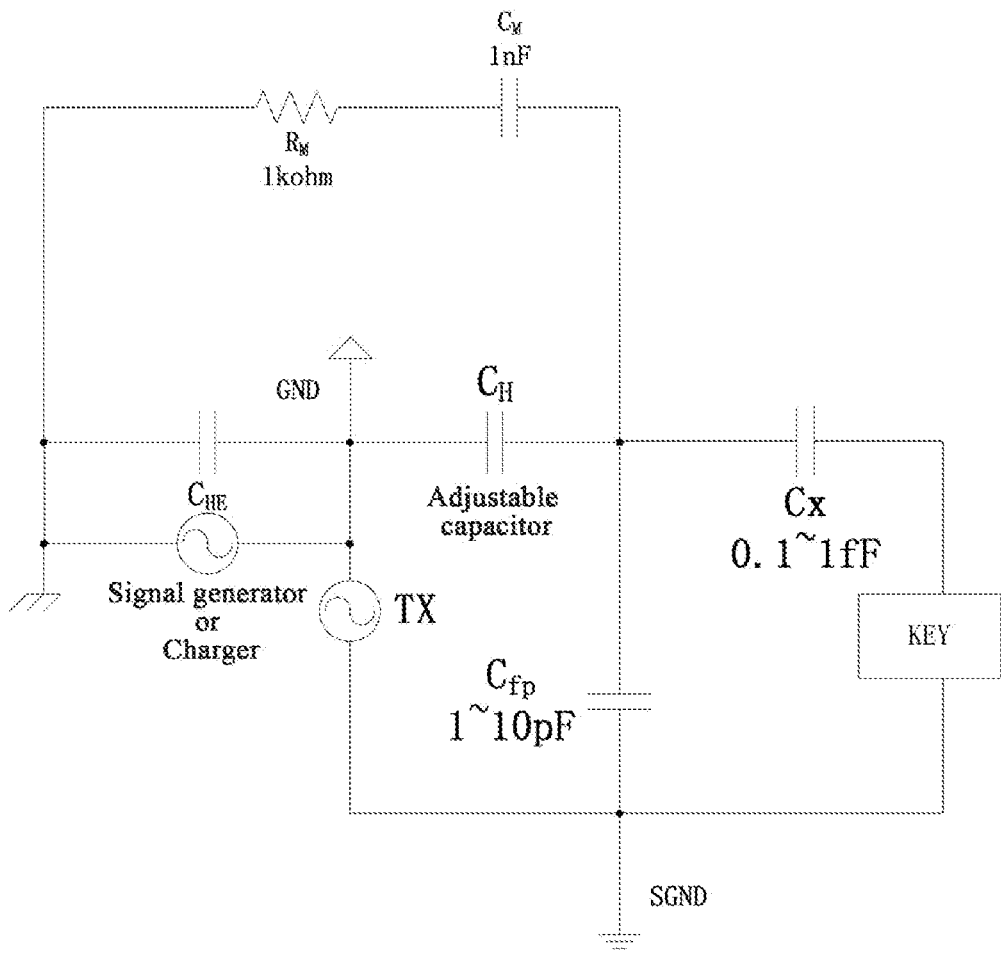
FIG. 1 is a reference schematic diagram of an equivalent circuit of a user touch screen.

In order to make those skilled in the art understand the solutions of the present application better, the technical solutions in the embodiments of the present application will be described hereunder clearly and completely with reference to the accompanying drawings in the embodiments of the present application. Obviously, the described embodiments are merely some embodiments of the present application, rather than all embodiments of the present application, and preferred embodiments of the present application are shown in the accompanying drawings. This application may be embodied in many different forms, but should not be limited to the embodiments described herein. Rather, these embodiments are provided so that this disclosure will be understood thoroughly and comprehensively. All other embodiments obtained by a person of ordinary skill in the art based on the embodiments of the present application without any creative effort shall fall into the protection scope of the present application.

Unless indicated otherwise, all technical and scientific terms used herein have the same meanings as commonly understood by one of ordinary skill in the art to which this application belongs. The terms used herein in the specification of this application is for the purpose of describing particular embodiments only, but should not be intended to limit the present application. The terms such as "first", "second" and the like in the specification and claims of the present application as well as in the above drawings are used to distinguish different objects but not to describe a particular order. Further, the terms such as "include" and "have" as well as any variation thereof are intended to cover non-exclusive inclusions. For example, processes, methods, systems, products or devices that include a series of steps or units are not limited to the listed steps or units, but may optionally include steps or units that are not listed, or optionally may also include other steps or units inherent to these processes, methods, products, or devices.

Reference of "an embodiment" herein means that a particular feature, structure, or characteristic described in combination with the embodiment maybe included in at least one embodiment of the present application. Such phrase appeared in various places in the specification does not necessarily refer to the same embodiment, nor is a separate or alternative embodiment that is mutually exclusive with other embodiments. It will be understood by those skilled in the art, both explicitly and implicitly, that the embodiments described herein may be combined with other embodiments.

Embodiment 1

The key detecting method provided in embodiments of the present application may be applied to a smart terminal, such as a smart phone, a tablet or other terminal devices, for detecting whether a key of the mobile terminal is touched or pressed, where the key may be a physical key (such as a Home button) or a touch virtual key with a fingerprint identification function, in particular a physical key or a virtual key using capacitive fingerprint identification technologies.

Figure 2:
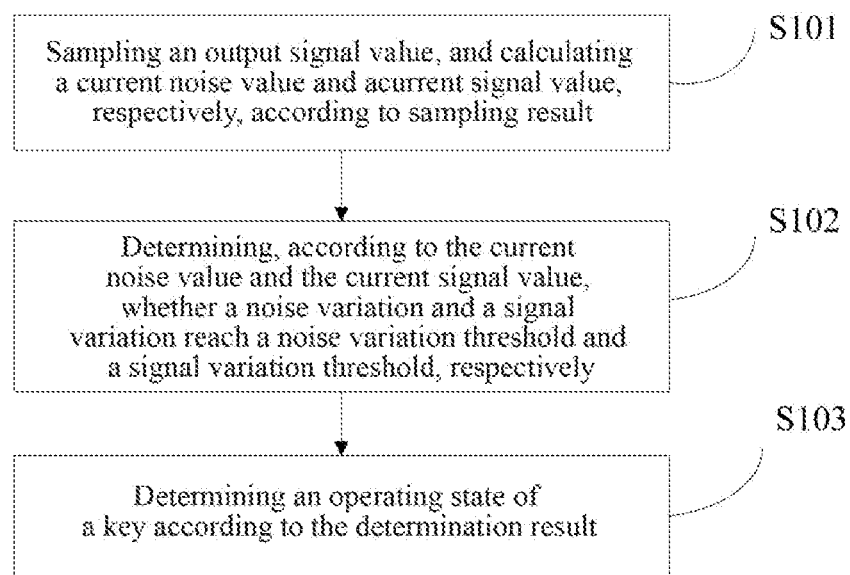
FIG. 2 is a schematic flowchart of a key detecting method according to the present application.

Reference may be made to FIG. 2, which is a schematic flowchart of an embodiment of a key detecting method provided in the present application. The key detecting method includes:

S101: sampling an output signal value of a system, and calculating a current noise value and a current signal value of the system respectively according to the sampling result.

In a specific embodiment, the output signal values of the system may refer to signal values output by a key module (or a button circuit) to a key detecting circuit, and the output signal values may be mainly used for detection of an operating state of a key; or, in other alternative embodiments, the output signal values of the system refer to values of test signals generated by a signal generator of the smart terminal or other excitation sources.

Figure 3:
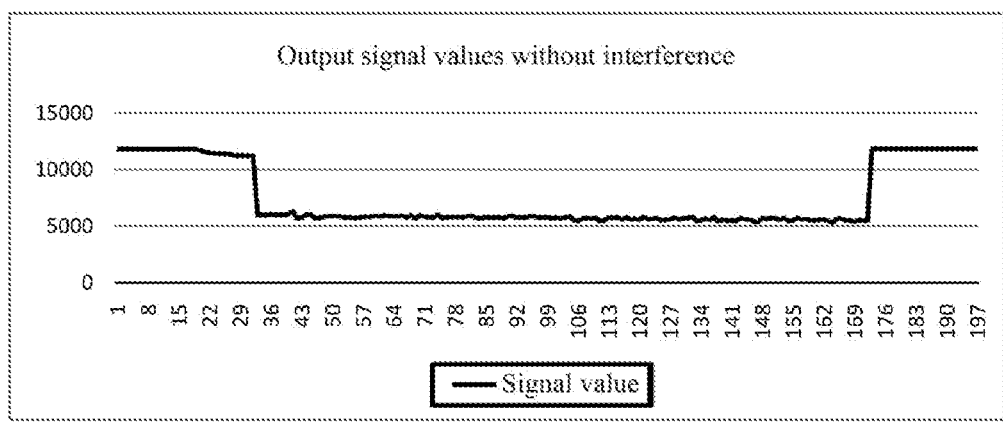
FIG. 3 is a schematic graph illustrating signal output values without interference.
Figure 4:
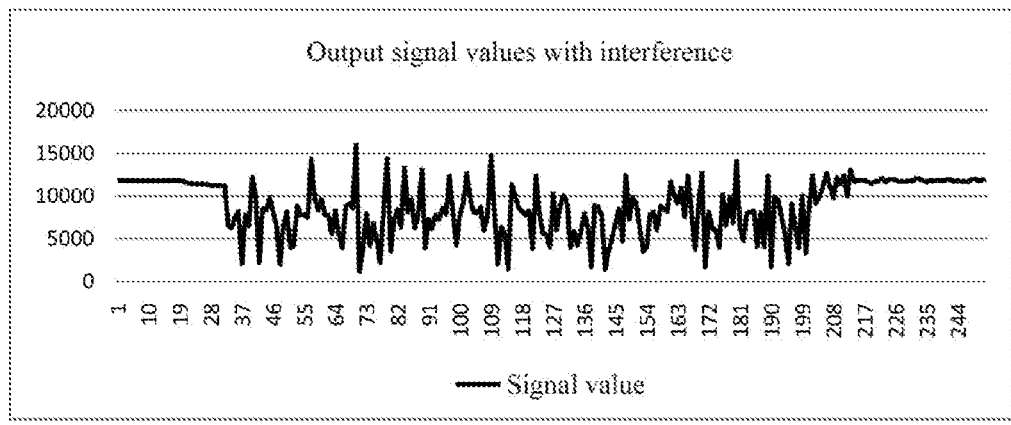
FIG. 4 is a schematic graph illustrating signal output values with interference.

Reference may be made to FIG. 3 and FIG. 4, which are output signal waveform graphs of the system when the smart terminal is in an initial state and an interfered state, respectively. The initial state may specifically refer to a state in which no external interference is introduced in the smart terminal, such as a normal operating state in which the smart terminal is not connected to any charger; reference may be made to FIG. 3, in the initial state, the output signal values of the system are substantially stable. The interfered state refers to a state in which external interference is introduced in the smart terminal, such as a state in which the charging common mode interference is introduced due to the smart terminal's connection to a charger; reference may be made to FIG. 4, in the interfered state, the output signal values of the system fluctuate irregularly with time.

In Step S101, sampling the output signal value of the system in real time, and calculating a current signal value and a current noise value according to the sampling result.

Optionally, in an embodiment of the present application, a sampling frequency is set for the output signal values of the system. The sampling frequency of the output signal values refers to the number X of signal samples collected per unit time, and X is a positive integer. In the embodiment of the present application, X is 8. In other embodiments of the present application, other values may be selected according to actual needs.

In a specific embodiment, description is made by taking an example where the output signal values of the system are sampled for X consecutive times in real time, and X sampling results may be obtained by performing the above sampling on the output signal values of the system, moreover, the current signal value (Ave_Current) and the current noise value (Noise_Current) may be obtained by calculating an average value and a peak-to-peak value of the X sampling results. Specifically, the average value of the X sampling results for the output signal values of the system may serve as the Ave_Current, and the peak value of the X sampling results for the output signal values of the system may serve as the Noise_Current.

S102: determining, according to the Noise_Current and the Ave_Current, whether a noise variation and a signal variation reach a noise variation threshold and a signal variation threshold, respectively.

In an embodiment of the present application, the noise variation may specifically be a difference between the current noise value and a base noise value (Noise_Base), and the signal variation may specifically be a difference between the Ave_Current and a base signal value (Ave_Base). In order to calculate the noise variation and the signal variation, the Noise_Base and the Ave_Base of the system need to be predetermined in the embodiment.

In a specific embodiment, the Noise_Base and the Ave_Base may be obtained in absence of a touch on the key of the smart terminal from a human hand by sampling and calculating the output signal values of the system in advance. For example, in an embodiment, Y base sampling results may be obtained in absence of a touch on the key of the smart terminal from a human hand by sampling the output signal values of the system for Y consecutive times, and an average value and a peak-to-peak value of the Y base sampling results may obtained through an average value calculation and a peak-to-peak value calculation, where calculations of the average value and the peak-to-peak value may serve as the base signal value Ave_Base and the base noise value Noise_Base, respectively. It should be understood that the Noise_Base and the Ave_Base may be obtained by sampling and calculating the output signal values of the system in advance before step S101.

Figure 5:
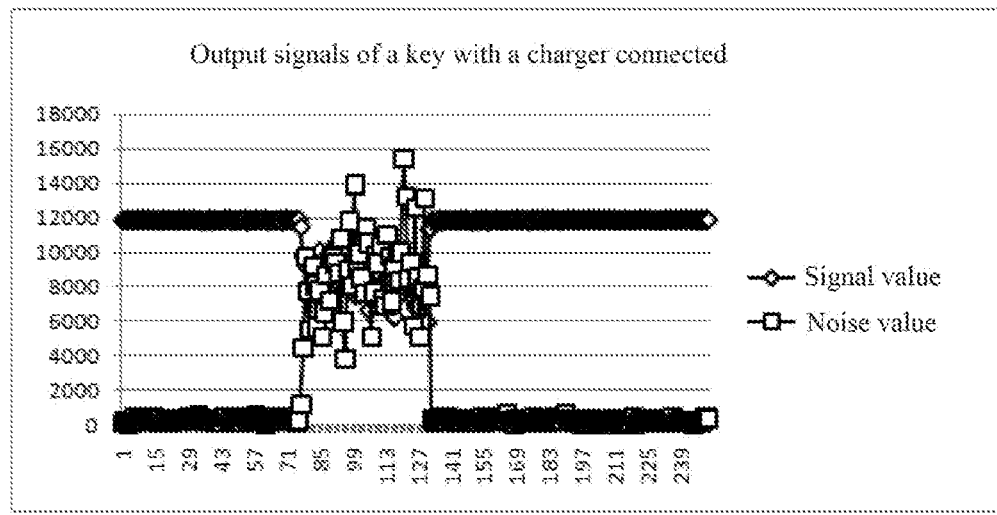
FIG. 5 is a schematic graph illustrating variation in noise values versus a variation in signal values.

In Step S102, the noise variation N0 and the signal variation S0 may be obtained respectively by calculating the difference between the Noise_Current and the Noise_Base and calculating the difference between the Ave_Current and the Ave_Base, in which, $N0 = \text{Noise\_Current} - \text{Noise\_Base}$ $S0 = \text{Ave\_Current} - \text{Ave\_Base}$ Reference may be to FIG. 5, after the smart terminal is connected to the charger, the Noise_Current or the Ave_Current of the system varies significantly when a user touches or presses a key, according to the differentiation, a corresponding noise variation threshold and signal variation threshold may be preset as a basis for detecting an operating state of the key.

Optionally, in an embodiment of the present application, the noise variation threshold and the signal variation threshold are preset respectively, and the noise variation threshold and the signal variation threshold may be set according to actual requirements respectively, which is not limited in the embodiment of the present application. By setting a reasonable noise variation threshold and a reasonable signal variation threshold, determination errors may be effectively avoided in the case of external interference, and the accuracy of the determination may be improved.

In this embodiment, the noise variation threshold and the signal variation threshold may be respectively denoted as $N_t$ and $S_t$, and the noise determination result and the signal determination result may be denoted as Noe and Sig, respectively.

When the noise variation reaches the noise variation threshold, the noise determination result Noe maybe set to 1, that is, when $N0 \geq N_t$, Noe=1; otherwise, when the noise variation is less than the noise variation threshold, the noise determination result Noe may be set to 0, that is, when $N0 < N_t$, Noe=0.

Similarly, when the signal variation reaches the signal variation threshold, the signal determination result Sig may be set to 1, that is, when $S0 \geq S_t$, Sig=1; otherwise, when the signal variation is less than signal variation threshold, the signal determination result Sig may be set to 0, that is, when $S0 < S_t$, Sig=0.

S103: determining an operating state of a key according to the determination result.

Given a case where there is no external common mode interference in the smart terminal, for example, a case where no charger is connected, a touch from a human hand then may not cause a significant variation in the noise variation, in this case the fact that whether the noise variation exceeds the noise variation threshold cannot be used as a condition to determine the state of the key of the system. Therefore, in this embodiment, in the case where there is no external common mode interference in the smart terminal, the operating state of the key may be determined according to the fact that whether the signal variation exceeds the signal variation threshold. While in a case where there is external common mode interference in the smart terminal, the noise variation may exceed the noise variation threshold when the human hand touches or presses the key; at this time, the operating state of the key may be determined according to the fact that whether the noise variation exceeds the noise variation threshold.

Specifically, in Step S103, when at least one of the signal variation and the noise variation reaches its corresponding signal variation threshold or noise variation threshold, it may be determined that the key is in a key-pressed state, that is, the key is in an operating state in which it is pressed or touched. Conversely, when the signal variation the noise variation fail to reach the signal variation threshold and the noise variation threshold, respectively, it may be determined that the key is in a key-released state, that is, the key is in an operating state in which it is not pressed or touched.

For example, in an embodiment of the application, the operating state of the key may be comprehensively determined according to K=Sig|Noe in Step S103, where K is the operating state of the key, Sig is the noise determination result, Noe is the signal determination result, and "|" is a logic OR operation.

Specifically, as long as the noise variation reaches the noise variation threshold or the signal variation reaches the signal variation threshold, that is, as long as any one of the noise determination result Noe and the signal determination result Sig is 1, the current operating state (K=1) of the key may be obtained according to K=Sig|Noe, that is, it is determined that the system is currently in the key-pressed state. When the noise variation is less than the noise variation threshold and the signal variation is less than the signal variation threshold, that is, both the noise determination result Noe and the signal determination result are 0, the current operating state (K=0) of the key may be obtained according to K=Sig|Noe, that is, it is determined that the system is currently in the key-released state.

In the embodiment of the present application, the key detecting method includes: sampling an output signal value of the system in real time and calculating a corresponding current noise value and current signal value; determining whether a noise variation and a signal variation are greater than a corresponding noise variation threshold or signal variation threshold; and comprehensively determining a state of a key of the smart terminal according to the noise determination result and the signal determination result. Compared to the prior art, there is no need to additionally provide a complex auxiliary circuit to realize detection of the state of the key in the embodiment of the present application, thereby reducing the cost and meanwhile improving the accuracy of the detection of the state of the key, enabling a user to obtain better user experience.

Embodiment 2

Figure 6:
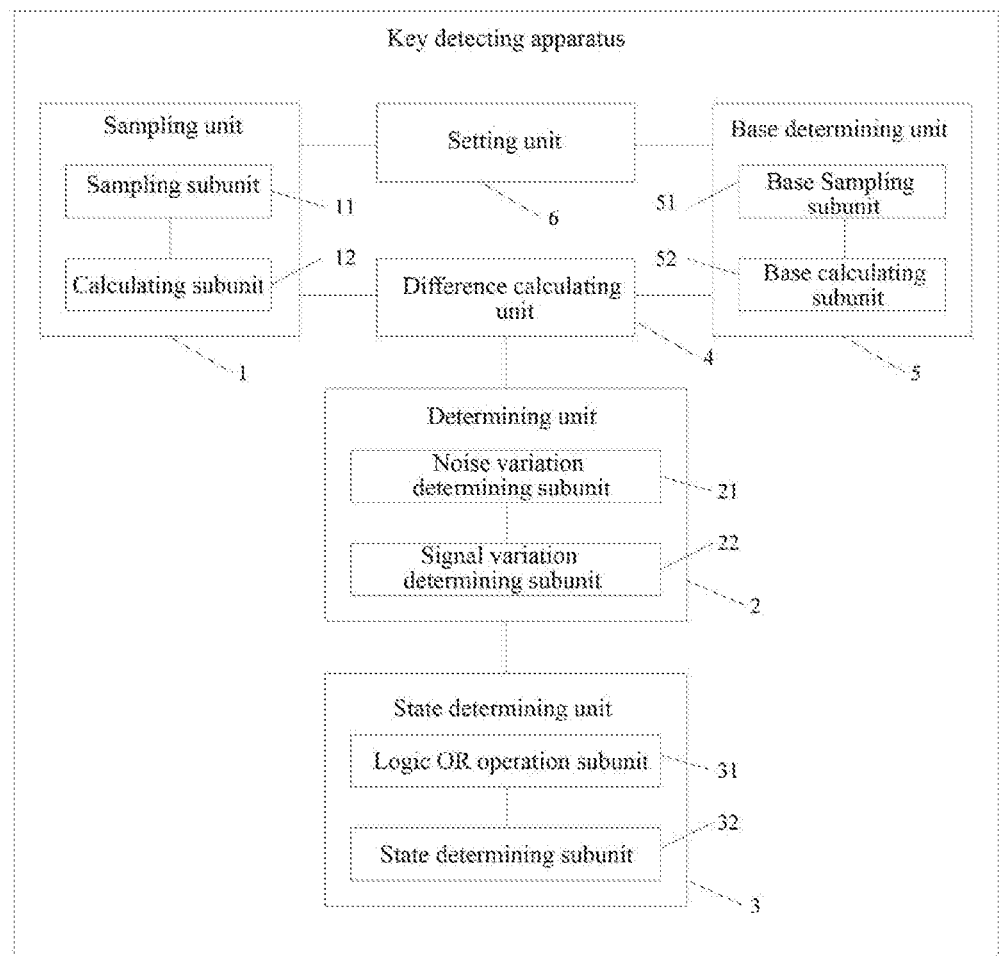
FIG. 6 is a schematic structural diagram of a key detecting apparatus according to the present application.

Reference may be made to FIG. 6, which is a schematic structural diagram of a key detecting apparatus according to the present application. The key detecting apparatus is located in a smart terminal. The smart terminal includes but is not limited to a smart phone, a tablet or other terminal devices. The key detecting apparatus includes a sampling unit 1, a determining unit 2, and a state determining unit 3.

The sampling unit 1 is configured to sample an output signal value and calculate a current noise value and a current signal value respectively according to the sampling result.

The determining unit 2 is configured to determine, according to the current noise value and the current signal value, whether a noise variation and a signal variation reach a corresponding noise variation threshold and signal variation threshold, respectively.

The state determining unit 3 is configured to determine an operating state of a key according to the determination result of the determining unit.

In a specific embodiment, the sampling unit 1 may include:

a sampling subunit 11, configured to sample the output signal value in real time for multiple consecutive times and obtain multiple sampling results; and a calculating subunit 12, configured to calculate an average value and a peak-to-peak value of the multiple sampling results, and use the average value and the peak-to-peak value as the current signal value and the current noise value, respectively.

Further, the key detecting apparatus may also include:

a difference calculating unit 4, configured to calculate a difference between the current noise value and a base noise value and use the difference as the noise variation, and calculate a difference between the current signal value and a base signal value and use the difference as the signal variation.

Further, the key detecting apparatus may further include:

a base determining unit 5, configured to predetermine the base noise value and the base signal value in the absence of a touch on the key from a human body.

In a specific embodiment, the base determining unit 5 may include:

a base sampling subunit 51, configured to sample, in the absence of the touch on the key from the human body, the output signal value for multiple consecutive times to obtain multiple base sampling results; and a base calculating subunit 52, configured to calculate an average value and a peak-to-peak value of the multiple base sampling results, and use the average value and the peak-to-peak value of the multiple base sampling results as the base signal value and the base noise value, respectively.

Optionally, in an embodiment, the state determining unit 3 may specifically be configured to: determine that the key is in a key-pressed state when at least one of the signal variation and the noise variation reaches its corresponding signal variation threshold or noise variation threshold; and determine that the key is in a key-released state when both the signal variation is less than the signal variation threshold and the noise variation is less than the noise variation threshold.

In a specific embodiment, the determining unit 2 may include:

a noise variation determining subunit 21, configured to set the noise determination result Noe to 1 when the difference between the current noise value and the base noise value reaches the preset noise variation threshold, otherwise, set the determination result Noe set to 0; and a signal variation determining subunit 22, configured to set the signal determination result Sig to 1 when the difference between the current signal value and the base signal value reaches the preset signal variation threshold, otherwise, set the determination result Sig to 0.

Optionally, in an embodiment, the state determining unit 3 may include:

a logic OR operation subunit 31, configured to perform a logic OR operation on the noise determination result Noe and the signal determination result Sig according to K=Sig|Noe, where K represents the operating state of the key, and "|" is a logic OR operation; and a state determining subunit 32, configured to determine that the key is in a key-pressed state when K=1, and determine that the key is in a key-released state when K=0.

Further, the key detecting apparatus may further include:

a setting unit 6, configured to set a sampling frequency of the output signal values. The sampling frequency of the output signal values refers to the number X of signal samples collected per unit time, and X is a positive integer. In the embodiment of the present application, the setting unit sets X to 8. In other embodiments of the present application, other values may be selected according to actual needs. It should be understood that the key detecting apparatus may be a detecting module including a processor or implemented in combination with other hardware units, of which the functional units may be implemented by hardware, software, or a combination of hardware and software, and for implementations of specific functions of the respective functional units, reference may be made to the description of the previous embodiments about the key detecting method provided in the present application and will not be described herein again.

In the foregoing embodiments provided in the present application, it should be understood that the disclosed apparatus and method may be implemented in other manners. For example, the device embodiments described above are merely illustrative, for example, the division of the units is only a logical function division, and other division manners may be used in actual implementations. For example, multiple units or components may be combined or integrated into another system, or some features maybe omitted or they are not executed.

The units described as separate parts may or may not be physically separated, and the parts illustrated as units may or may not be physical units, that is, may be located in one place, or may be distributed on multiple network units. Some or all of the units may be selected according to actual needs to achieve the purpose of the solution of the embodiment.

The above descriptions are merely embodiments of the present application, which do not limit the scope of the present application. Although the present application has been described in detail with reference to the foregoing embodiments, it is still possible for those skilled in the art to modify the technical solutions described in foregoing specific implementations or equivalently replace some of the technical features. Any equivalent structure that is obtained using the contents of the specification and the drawings or that is used directly or indirectly in other related technical fields shall all fall into the protection scope of the present application for a similar reason.

What is claimed is:

1. A key detecting method, comprising:

sampling an output signal value in real time for multiple consecutive times and obtaining multiple sampling results;

calculating an average value and a peak-to-peak value of the multiple sampling results, and using the average value and the peak-to-peak value as a current signal value and a current noise value, respectively;

determining, according to the current noise value and the current signal value, whether a noise variation and a signal variation reach a corresponding noise variation threshold and signal variation threshold, respectively; and determining an operating state of a key according to the determination result.

2. The key detecting method according to claim 1, wherein the noise variation is a difference between the current noise value and a base noise value, and the signal variation is a difference between the current signal value and a base signal value.

3. The key detecting method according to claim 2, further comprising:

in the absence of a touch on the key from a human body, sampling the output signal value for multiple consecutive times to obtain multiple base sampling results; and calculating an average value and a peak-to-peak value of the multiple base sampling results, and using the average value and the peak-to-peak value of the multiple base sample results as the base signal value and the base noise value, respectively.

4. The key detecting method according to claim 2, wherein the determining an operating state of a key according to the determination result comprises:

determining that the key is in a key-pressed state when at least one of the signal variation and the noise variation reaches its corresponding signal variation threshold or noise variation threshold; and determining that the key is in a key-released state when both the signal variation is less than the signal variation threshold and the noise variation is less than the noise variation threshold.

5. The key detecting method according to claim 2, wherein the determining whether a noise variation and a signal variation reach corresponding noise variation threshold and signal variation threshold comprises:
setting the noise determination result Noe to 1 when the difference between the current noise value and the base noise value reaches the preset noise variation threshold, otherwise, setting the noise determination result Noe to 0; and
setting a signal determination result Sig to 1 when the difference between the current signal value and the base signal value reaches the preset signal variation threshold, otherwise, setting the signal determination result Sig to 0.

6. The key detecting method according to claim 5, wherein the determining the operating state of a key according to the determination result comprises:
determining the operating state of the key according to K=Sig|Noe, wherein K represents the operating state of the key, Noe is the noise determination result, Sig is the signal determination result, and "|" is a logic OR operation; and
determining that the key is in a key-pressed state when K=1, and determining that the key is in a key-released state when K=0.

7. A key detecting apparatus, comprising a processor to execute a key detecting method which comprises steps of:
sampling an output signal value in real time for multiple consecutive times and obtaining multiple sampling results;
calculating an average value and a peak-to-peak value of the multiple sampling results, and using the average value and the peak-to-peak value as a current signal value and a current noise value, respectively;
determining, according to the current noise value and the current signal value, whether a noise variation and a signal variation reach a corresponding noise variation threshold and a corresponding signal variation threshold, respectively; and
determining an operating state of a key according to the determination result.

8. The key detecting apparatus according to claim 7, wherein the key detecting method further comprises steps of:
calculating a difference between the current noise value and a base noise value and use the difference as the noise variation, and calculating a difference between the current signal value and a base signal value and use the difference as the signal variation.

9. The key detecting apparatus according to claim 8, wherein the key detecting method further comprises steps of:
predetermining the base noise value and the base signal value in the absence of a touch on the key from a human body.

10. The key detecting apparatus according to claim 9, wherein the predetermining the base noise value and the base signal value in the absence of a touch on the key from a human body comprises:
sampling, in the absence of the touch on the key from the human body, the output signal value for multiple consecutive times to obtain multiple base sampling results; and calculating an average value and a peak-to-peak value of the multiple base sampling results, and using the average value and the peak-to-peak value of the multiple base sampling results as the base signal value and the base noise value, respectively.

11. The key detecting apparatus according to claim 9, wherein the determining an operating state of a key according to the determination result comprises: determining that the key is in a key-pressed state when at least one of the signal variation and the noise variation reaches its corresponding signal variation threshold or noise variation threshold; and determining that the key is in a key-released state when both the signal variation is less than the signal variation threshold and the noise variation is less than the noise variation threshold.

12. The key detecting apparatus according to claim 9, wherein the determining, according to the current noise value and the current signal value, whether a noise variation and a signal variation reach a corresponding noise variation threshold and a corresponding signal variation threshold comprises:
setting the noise determination result Noe to 1 when the difference between the current noise value and the base noise value reaches the preset noise variation threshold, otherwise, setting the noise determination result Noe to 0; and
setting the signal determination result Sig to 1 when the difference between the current signal value and the base signal value reaches the preset signal variation threshold, otherwise, setting the signal determination result Sig to 0.

13. The key detecting apparatus according to claim 12, wherein the determining an operating state of a key according to the determination result comprises:
performing a logic OR operation on the noise determination result Noe and the signal determination result Sig according to K=Sig|Noe, wherein K represents the operating state of the key, and "|" is a logic OR operation; and
determining that the key is in a key-pressed state when K=1, and determining that the key is in a key-released state when K=0.

14. A key detecting method, comprising: sampling on an output signal value of a key when there is external common mode interference, and calculating a current noise value; determining, according to the current noise value, whether a noise variation reaches a noise variation threshold; and determining that the key is in a key-pressed state when the noise variation reaches the noise variation threshold;
determining whether the signal variation reaches the signal variation threshold according to a current signal value when there is no external common mode interference, and
determining that the key is in the key-pressed state when the signal variation reaches the signal variation threshold.

15. The key detecting method according to claim 14, wherein the external common mode interference comprises charging common mode interference introduced via a connection to a charger.

16. The key detecting method according to claim 14, wherein the current noise value is obtained by calculating a peak-to-peak value of multiple sampling results obtained by sampling the output signal value in real time for multiple consecutive times.

17. The key detecting method according to claim 14, wherein the noise variation is a difference between the current noise value and a base noise value, wherein the base noise value is obtained by calculating a peak-to-peak value of multiple base sampling results obtained by sampling, in the absence of a touch on the key from a human body, the output signal value for multiple consecutive times.

* * * * *